United States Patent
Kim et al.

(10) Patent No.: US 10,522,598 B2
(45) Date of Patent: Dec. 31, 2019

(54) DISPLAY DEVICE INCLUDING A COLOR COLUMN OF PIXELS AND A WHITE COLUMN OF PIXELS AND DRIVING METHOD THEREOF

(71) Applicant: Samsung Display Co., Ltd., Yongin-si, Gyeonggi-do (KR)

(72) Inventors: Mu Gyeom Kim, Hwaseong-si (KR); Hee Soo Yoo, Seoul (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 299 days.

(21) Appl. No.: 15/073,541

(22) Filed: Mar. 17, 2016

(65) Prior Publication Data
US 2016/0322000 A1  Nov. 3, 2016

(30) Foreign Application Priority Data
Apr. 28, 2015  (KR) .................. 10-2015-0060005

(51) Int. Cl.
| | |
|---|---|
| G09G 5/10 | (2006.01) |
| H01L 27/32 | (2006.01) |
| G09G 3/20 | (2006.01) |
| G09G 3/36 | (2006.01) |

(52) U.S. Cl.
CPC ....... H01L 27/3218 (2013.01); G09G 3/2003 (2013.01); G09G 3/3607 (2013.01); H01L 27/3213 (2013.01); G09G 2300/0452 (2013.01)

(58) Field of Classification Search
CPC ............ H01L 27/3218; H01L 27/3213; G09G 3/2003; G09G 3/3607
USPC ........................................................ 345/691
See application file for complete search history.

(56) References Cited

U.S. PATENT DOCUMENTS

| | | | |
|---|---|---|---|
| 7,221,381 B2 | 5/2007 | Elliott et al. | |
| 2005/0225563 A1* | 10/2005 | Brown Elliott | G09G 5/02 345/604 |
| 2005/0270444 A1* | 12/2005 | Miller | G09G 3/3216 349/108 |
| 2007/0064020 A1* | 3/2007 | Credelle | G09G 3/2003 345/694 |
| 2010/0118045 A1* | 5/2010 | Brown Elliott | G02B 27/2214 345/589 |
| 2011/0285746 A1* | 11/2011 | Swic | G09G 5/02 345/597 |

(Continued)

FOREIGN PATENT DOCUMENTS

| | | |
|---|---|---|
| KR | 10-2004-0004616 A | 1/2004 |
| KR | 10-2005-0059396 A | 6/2005 |
| KR | 10-2008-0093307 A | 10/2008 |

(Continued)

*Primary Examiner* — Jonathan M Blancha
(74) *Attorney, Agent, or Firm* — F. Chau & Associates, LLC

(57) ABSTRACT

A display device is disclosed. In one aspect, a plurality of unit columns of pixels are arranged in a first direction. At least one of the unit columns includes a color column of pixels including a plurality of color pixels each configured to display a plurality of colors other than white. The unit columns also include a white column of pixels including a plurality of white pixels arranged in a second direction crossing the first direction, wherein the color column includes first to third color pixels configured to respectively display first to third colors different from each other.

12 Claims, 12 Drawing Sheets

(56) References Cited

U.S. PATENT DOCUMENTS

2015/0116375 A1* 4/2015 Yang .................... G09G 3/2003
                                                              345/690

FOREIGN PATENT DOCUMENTS

| KR | 10-2012-0093003 A | 8/2012 |
| KR | 20-2012-0093003 A | 8/2012 |

* cited by examiner

FIG. 4

DISPLAY DEVICE INCLUDING A COLOR COLUMN OF PIXELS AND A WHITE COLUMN OF PIXELS AND DRIVING METHOD THEREOF

CROSS-REFERENCE TO RELATED APPLICATION

This application claims priority to and the benefit of Korean Patent Application No. 10-2015-0060005 filed in the Korean Intellectual Property Office on Apr. 28, 2015, the entire contents of which are incorporated herein by reference.

BACKGROUND

Field

The described technology generally relates to a display device and a driving method thereof.

Description of the Related Technology

Examples of display devices currently used include liquid crystal displays, organic light-emitting diode (OLED) displays, electrophoretic displays, and the like.

A display device includes a matrix of pixels and a plurality of display signal lines. The respective pixels include switching elements and pixel electrodes connected to the switching elements, and the switching elements are connected to the display signal lines. The display signal lines include gate lines transferring gate signals and data lines transferring data signals. The pixel electrodes receive the data signals depending on the gate signals through the switching elements such as thin film transistors, or the like. The gate signals are generated by a gate driver depending on a control of a signal controller and are output to a plurality of gate lines, and the data signals can be obtained by a data driver receiving digital image signals from the signal controller and converting the digital image signals into data voltages.

Most of the pixels of the display device include color pixels such as a red pixel, a green pixel, a blue pixel, and the like, that can each display images of a red, a green, and a blue, which are three primary colors. The red pixel, the green pixel, and the blue pixel can be included in one unit pixel that can display one image. Luminances of a plurality of color pixels included in each unit pixel can be adjusted to implement various color displays.

However, in the case of displaying an image only by the red pixel, the green pixel, and the blue pixel, a luminance of the image can degrade. For example, in the case of a liquid crystal display, since a color pixel includes a color filter, an amount of light emitted from a backlight is decreased while the light passing through the color filter, such that a luminance of an image can be decreased. In order to solve the above-mentioned problem, a white pixel that does not include the color filter to be able to represent a white color can be further included, in addition to the color pixels representing primary colors. Since the white pixel does not include the color filter, it can increase the luminance of the image.

The pixels including the color pixels and the white pixel can be formed in a stripe form in which pixels representing the same colors are formed in the same columns or be formed in a PenTile form in which pixels representing different colors are alternately formed in the same columns.

In the display device in which the pixels are formed in the PenTile form, a rendering driving method of displaying an image by sharing pixels positioned in the vicinity of pixels for an image that is to be displayed in addition to the pixels for the image can be used. According to the rendering driving method, an image having a high resolution can be displayed using a small number of pixels.

The above information disclosed in this Background section is only for enhancement of understanding of the background of the described technology and therefore it can contain information that does not constitute the prior art that is already known in this country to a person of ordinary skill in the art.

SUMMARY OF CERTAIN INVENTIVE ASPECTS

One inventive aspect relates to a display device including a white pixel, and a driving method thereof.

Another aspect is a display device and a driving method thereof having favorable characteristics of displaying an image having a high luminance and a high resolution by allowing a display device including a white pixel to have a pixel layout in which it can be rendering-driven using sharing of various pixels.

Another aspect is a display device including: a plurality of unit columns arranged in a row direction, wherein one of the unit columns includes a color column including a plurality of color pixels representing colors other than white and a white column including a plurality of white pixels arranged in a column direction, and the color column includes a first color pixel, a second color pixel, and a third color pixel representing different colors from each other.

The plurality of color pixels included in the color column can be arranged in at least two pixel columns.

Two color pixels adjacent to each other in a first diagonal direction in the color column can represent the same color as each other.

Two color pixels adjacent to each other in a second diagonal direction different from the first diagonal direction in the color column can represent different colors from each other.

A length of the white pixel in the column direction can be approximately two times a length of the color pixel in the column direction.

The white pixels included in two unit columns adjacent to each other among the plurality of unit columns can be aligned with each other.

The white pixels included in two unit columns adjacent to each other among the plurality of unit columns can be formed to be alternated with each other.

Layouts of the plurality of color pixels positioned in the color columns each included in a first unit column, a second unit column, and a third unit column adjacent to each other among the plurality of unit columns can be different from each other in the first to third unit columns.

A length of the white pixel in the column direction can be approximately two times a length of the color pixel in the column direction.

The white pixels included in two unit columns adjacent to each other among the plurality of unit columns can be aligned with each other.

The white pixels included in two unit columns adjacent to each other among the plurality of unit columns can be formed to be alternated with each other.

A length of the white pixel in the row direction can be smaller than a length of the color pixel in the row direction.

The plurality of color pixels formed in two pixel columns adjacent to each other may not be aligned with each other in the row direction, but can be formed to be alternated with each other, and the plurality of color pixels positioned in the pixel column and the plurality of white pixels positioned in the white column adjacent to the pixel column in the row direction may not be aligned with each other in the row direction, but can be formed to be alternated with each other.

The color pixel and the white pixel can have shapes and/or sizes that are substantially the same as each other.

The display device can further include: a signal controller receiving and processing an input image signal; and a rendering driver receiving the processed image signal from the signal controller and rendering the received image signal in a unit of a unit pixel including the white pixel and a plurality of color pixels adjacent to the white pixel and representing different colors from each other.

A first unit pixel and a second unit pixel among the unit pixel can share at least one color pixel with each other.

Another aspect is a driving method of a display device including a plurality of unit columns arranged in a row direction, one of the unit columns including a color column including a plurality of color pixels representing colors other than white and a white column including a plurality of white pixels arranged in a column direction, the method including: receiving an input image signal and rendering the image signal by a unit of a unit pixel to output an output image signal; and generating a data voltage based on the rendered output image signal and inputting the data voltage to the plurality of unit columns, the unit pixel includes the white pixel and a plurality of color pixels adjacent to the white pixel and representing different colors from each other.

The plurality of color pixels included in the color column can be arranged in at least two pixel columns.

A first unit pixel and a second unit pixel among the unit pixel can share at least one color pixel with each other.

The input image signal can include image signals corresponding to a plurality of colors represented by the plurality of color pixels.

Another aspect is a display device, comprising: a plurality of unit columns of pixels arranged in a first direction. At least one of the unit columns includes: a color column of pixels including a plurality of color pixels each configured to display a plurality of colors other than white; and a white column of pixels including a plurality of white pixels arranged in a second direction crossing the first direction, wherein the color column includes first to third color pixels configured to respectively display first to third colors different from each other.

In the above display device, the color column includes at least two pixel columns including the color pixels.

In the above display device, two color pixels adjacent to each other in a first diagonal direction in the color column are configured to display substantially the same color as each other.

In the above display device, another two color pixels adjacent to each other in a second diagonal direction different from the first diagonal direction in the color column are configured to display different colors from each other.

In the above display device, the length of the white pixels in the second direction is about two times the length of the color pixel in the second direction.

In the above display device, the white pixels included in two adjacent unit columns are aligned in the first direction.

In the above display device, the white pixels included in two adjacent unit columns are not aligned in the first direction.

In the above display device, the unit columns comprise first to third columns that are adjacent to each other in the first direction, wherein the arrangements of the color pixels included in one of the first to third unit columns are different from the color pixels in the others of the first to third unit columns.

In the above display device, the length of the white pixels in the second direction is about two times the length of the color pixel in the second direction.

In the above display device, the white pixels included in two adjacent unit columns are aligned in the first direction.

In the above display device, the white pixels included in two adjacent unit columns are not aligned in the first direction.

In the above display device, the length of the white pixels in the first direction is less than the length of the color pixel in the first direction.

In the above display device, the color pixels in every other pixel column in the first direction are aligned with each other in the first direction, wherein the color pixels in the pixel column and the white pixels in the white column adjacent to the pixel column in the first direction are alternately arranged in the first direction.

In the above display device, the color pixel and the white pixels have shapes or sizes that are substantially the same as each other.

The display device further comprises: a signal controller configured to receive and process an input image signal; and a rendering driver configured to receive the processed image signal from the signal controller and render the received image signal for a unit pixel including the white pixels and a plurality of color pixels adjacent to the white pixel.

In the above display device, the unit pixel includes a first unit pixel and a second unit pixel sharing at least one of the color pixels with each other.

Another aspect is a method of driving a display device including a plurality of unit columns of pixels arranged in a first direction, at least one of the unit columns including a color column of pixels including a plurality of color pixels configured to display colors other than white and a white column of pixels including a plurality of white pixels arranged in a second direction crossing the first direction. The method comprises: receiving an input image signal; rendering the image signal for a unit pixel to output an output image signal; generating a data voltage based on the rendered output image signal; and inputting the data voltage to the unit columns, wherein the unit pixel includes the white pixel and a plurality of the color pixels adjacent to the white pixel and configured to display different colors.

In the above method, the color pixels included in the color column are arranged in at least two pixel columns.

In the above method, the unit pixels include a first unit pixel and a second unit pixel sharing at least one of the color pixels with each other.

In the above method, the input image signal includes an image signal corresponding to a plurality of colors to be displayed by the color pixels.

According to at least one of the disclosed embodiments, the display device including the white pixels can be rendering-driven using the sharing of various pixels, such that a natural image having a high luminance and a high resolution can be displayed.

BRIEF DESCRIPTION OF THE DRAWINGS

FIGS. 2, 3, 4, 5, 6, 7, 8, 9, 10 and 11 are views illustrating a pixel layout and a driving method of a display device according to an exemplary embodiment, respectively.

DETAILED DESCRIPTION OF CERTAIN INVENTIVE EMBODIMENTS

Figure 1:
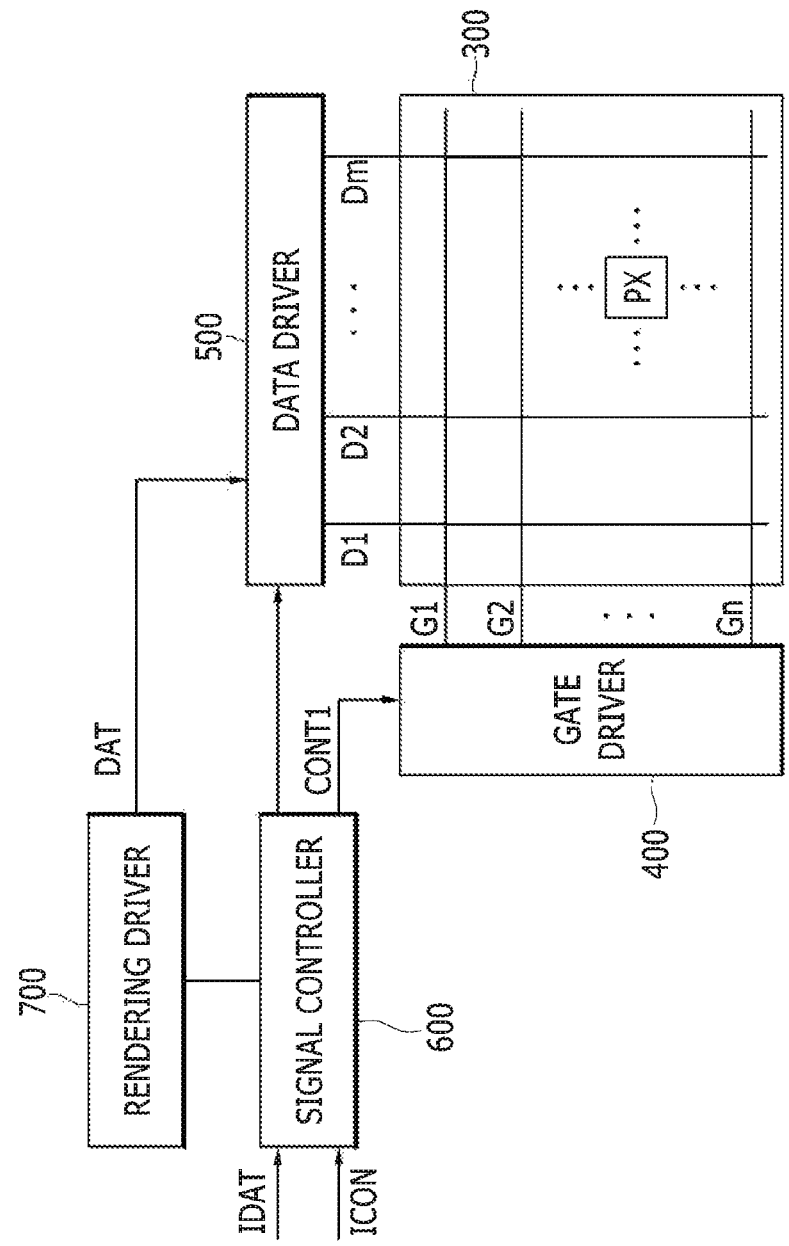
FIG. 1 is a block diagram of a display device according to an exemplary embodiment.

Hereinafter, exemplary embodiments will be described more fully with reference to the accompanying drawings so as to be easily practiced by those skilled in the art to which the described technology pertains. As those skilled in the art would realize, the described embodiments can be modified in various different ways, all without departing from the spirit or scope of the described technology.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements can also be present. In contrast, when an element is referred to as being "directly on" another element, there are no intervening elements present.

Portions unrelated to the description will be omitted in order to obviously describe the described technology, and similar components will be denoted by the same reference numerals throughout the present specification.

Throughout this specification and the claims that follow, when it is described that an element is "coupled" to another element, the element can be "directly coupled" to the other element or "electrically coupled" to the other element through a third element. In addition, throughout the present specification, unless explicitly described to the contrary, the word "comprise" and variations such as "comprises" or "comprising", will be understood to imply the inclusion of stated elements but not the exclusion of any other elements.

Hereinafter, a display device and a driving method thereof according to an exemplary embodiment will be described in detail with reference to the accompanying drawings. In this disclosure, the term "substantially" includes the meanings of completely, almost completely or to any significant degree under some applications and in accordance with those skilled in the art. The term "connected" can include an electrical connection.

First, a display device according to an exemplary embodiment will be described with reference to FIG. 1.

FIG. 1 is a block diagram of a display device according to an exemplary embodiment.

The display device according to an exemplary embodiment includes a display panel 300, a gate driver 400, a data driver 500, a signal controller 600 controlling the data driver 500 and the gate driver 400, and a rendering driver 700.

The display panel 300 can be a display panel included in various flat panel displays (FPDs) such as a liquid crystal display (LCD), an organic light-emitting diode (OLED) display, an electrowetting display (EWD), and the like.

The display panel 300 includes a plurality of gate lines G1 to Gn, a plurality of data lines D1 to Dm, and a plurality of pixels PXs connected to the gate lines G1 to Gn and the data lines D1 to Dm.

The gate lines G1 to Gn can transfer gate signals, be extended approximately in a row direction, and be substantially in parallel with each other. The data lines D1 to Dm can transfer data voltages, be extended approximately in a column direction, and be substantially in parallel with each other.

The pixels PXs can be regularly formed, for example, approximately in a matrix form. Each pixel PX can include at least one switching element connected to a corresponding gate line G1 to Gn and a corresponding data line D1 to Dm and at least one pixel electrode connected to the at least one switching element. The switching element can include at least one thin film transistor, and can be turned on or turned off depending on the gate signals transferred by the gate lines G1 to Gn to transfer the data voltages transferred by the data line D1 to Dm to the pixel electrode. Each pixel PX can display an image having a corresponding luminance depending on the data voltage applied to the pixel electrode.

The pixels PXs includes a plurality of color pixels that can represent primary colors such as a red, a green, a blue, and the like, and a white pixel that can represent a white/transparent color. The color pixels can include a first color pixel, a second color pixel, and a third color pixel. For example, the first color pixel represents red, the second color pixel represents green, and the third color pixel represents blue. However, primary colors represented by the color pixels are not limited thereto, but can be various colors such as cyan, magenta, yellow, and the like. Three color pixels can display a white image together with each other.

The signal controller 600 receives input image signals IDAT and input control signals ICON controlling displays of the input image signals IDAT from an external graphic processor (not shown), and the like. The input image signals IDAT can include image signals for primary colors represented by the first to third color pixels. For example, the input image signals IDAT include red, green and blue image signals.

The signal controller 600 appropriately processes the input image signals IDAT based on the input image signals IDAT and the input control signals ICON. The signal controller 600 generates gate control signals CONT1, data control signals CONT2, and the like, based on the input image signals IDAT and the input control signals ICON. The signal controller 600 transmits the gate control signals CONT1 to the gate driver 400 and transmits the data control signals CONT2 to the data driver 500.

The signal controller 600 can transfer the processed image signals to the rendering driver 700.

The rendering driver 700 converts the image signals received from the signal controller 600 into image signals having four colors including a plurality of primary colors represented by the plurality of color pixels and a white, renders the converted image signals to generate output image signals DAT, and provides the output image signals DAT to the data driver 500. In detail, the rendering driver 700 stores the image signals from the signal controller 600 in a line unit and then renders the image signals so as to be appropriate for the display panel 300, thereby converting the image signals into the image signals having the four colors including the primary colors and the white. The converted image signals having the four colors including the primary colors and the white can be rendered in a unit of a unit pixel configured of a predetermined number of pixels PXs. The unit pixel can be configured by various methods to be described below.

The rendering driver 700 is not limited to being positioned at a place shown in FIG. 1, but can be positioned at another place. For example, the rendering driver 700 is positioned in the signal controller 600.

The gate driver 400 receives the gate control signals CONT1 from the signal controller 600 and generate gate signals configured of a combination of a gate-on voltage Von that can turn on the switching element of the pixel PX and a gate-off voltage Voff that can turn off the switching element of the pixel PX based on the gate control signals CONT1. The gate control signal CONT1 includes a scan start signal indicating a scan start, at least one gate clock signal controlling an output time of the gate-on voltage Von, and the like. The gate driver 400 is connected to the gate lines G1 to Gn of the display panel 300 and applies the gate signals to the gate lines G1 to Gn.

The data driver 500 receives the data control signals CONT2 and the output image signals DAT from the signal controller 600 and selects gray voltages corresponding to the respective output image signals DAT to generate data voltages, which are analog data signals, as the output image signals DAT. The data control signal CONT2 includes a horizontal synchronization start signal indicating a transmission start of the output image signals DAT for one row of pixels PX, at least one data load signal instructing the data voltage to be applied to the data lines D1 to Dm, a data clock signal, and the like. The data control signal CONT2 can further include an inversion signal inverting a polarity (referred to as a polarity of the data voltage) of the data voltage Vd for a common voltage Vcom. The data driver 500 is connected to the data lines D1 to Dm of the display panel 300 and applies the data voltage to the corresponding data lines D1 to Dm.

In the case in which the display device according to an exemplary embodiment is a light receiving type display device, it can further include a backlight unit (not shown). The backlight unit 900 can include a plurality of light sources generating light and an optical member sending the light generated in the light sources toward the display panel 300 and improving efficiency of the light.

Next, a pixel layout and a driving method of a display device according to an exemplary embodiment will be described with reference to FIGS. 2 to 9 together with FIG. 1.

FIGS. 2 to 9 are views illustrating a pixel layout and a driving method of a display device according to an exemplary embodiment, respectively.

The display device according to an exemplary embodiment includes a plurality of color pixels R, G and B and a white pixel W, as described above. The color pixels R, G, and B can include a first color pixel R, a second color pixel G, and a third color pixel B. Most of the color pixels R, G, and B and the while pixel W shown in FIGS. 2 to 11 can be transmitting regions through which the respective pixels R, G, B, and W transmit light. Light blocking members that can block the light can be positioned between neighboring pixels R, G, B, and W. Although only the case in which a kind of color pixels R, G, and B is three (first to third color pixels R, G, and B) has been described in the present exemplary embodiment, the number of color pixels R, G, and B is not limited thereto.

The color pixels R, G, and B and the white pixels W can configure a plurality of unit columns C1, C2, C3, . . . that are sequentially arranged. The respective unit columns C1, C2, C3, . . . include color columns C11, C21, C31, . . . in which the color pixels R, G, and B are arranged and white columns C12, C22, C32, . . . in which the white pixels W are arranged. The color columns C11, C21, C31, . . . and the white columns C12, C22, C32, . . . can be adjacent to each other. Therefore, when generally viewed, the color columns C11, C21, C31, . . . and the white columns C12, C22, C32, . . . can be alternately formed in the row direction.

The respective color columns C11, C21, C31, . . . include at least two pixel columns adjacent to each other. Although an example in which the respective color columns C11, C21, C31, . . . include the two pixel columns will be mainly described in the present exemplary embodiment, the number of pixel columns is not limited thereto.

Two kinds of color pixels R, G, and B representing two different colors from each other are alternately arranged in the column direction in a first pixel column formed at the left in the two pixel columns included in one color column C11, C21, C31, . . . , and two kinds of color pixels R, G, and B representing two different colors are also alternately arranged in the column direction in a second pixel column, which is the other pixel column. One color pixel R, G, and B of two color pixels R, G, and B included in the first pixel column and one color pixel R, G, and B of two color pixels R, G, and B included in the second pixel column can represent the same color. In addition, the other color pixel R, G, and B of the two color pixels R, G, and B included in the first pixel column and the other color pixel R, G, and B of the two color pixels R, G, and B included in the second pixel column can represent different colors from each other. Two color pixels R, G, and B adjacent to each other in the row direction in one color column C11, C21, C31, . . . can represent different colors from each other.

Layouts of color pixels R, G, and B included in color columns C11, C21, C31, . . . included in three unit columns C1, C2, C3, . . . adjacent to each other can be different from each other, layouts of pixels R, G, B, and W included in the three unit columns C1, C2, C3, . . . adjacent to each other can be repeated in the row direction.

Sizes of the color pixels R, G and B can be constant or be different from each other. A shape and/or a size of the white pixel W can be different from those of the color pixels R, G, and B. A shape of each of the color pixels R, G and B and the white pixel W can be approximately a quadrangle, but is not limited thereto.

A length L2 of the white pixel W in one direction (for example, a column direction) can be greater than a length L1 of the color pixels R, G, and B in one direction. For example, the length L2 of the white pixel W in one direction is approximately two times the length L1 of the color pixels R, G, and B in one direction Here, in the respective unit columns C1, C2, C3, . . . , one white pixel W can be formed to neighbor to and be aligned with two color pixels R, G, and B adjacent to each other in the column direction. In addition, upper and lower edges of the white pixel W and the two color pixels R, G, and B adjacent to each other can be aligned with each other. That is, the respective white pixels W can be formed to correspond to the two color pixels R, G, and B.

Unlike this, one white pixel W that is shown can also be divided into two white pixels of which a length in the column direction is approximately the same as the length L1.

A length of the white pixel W in the row direction is shorter than that of the color pixels R, G, and B in the row direction, but is not limited thereto.

First, referring to FIGS. 2 to 5, the first color pixel R and the third color pixel B can be alternately arranged in a first pixel column of a color column C11 of a first unit column C1, and the first color pixel R and the second color pixel G can be alternately arranged in a second pixel column of the color column C11 of the first unit column C1. In the color column C11, the first color pixels R are adjacent to each other in one diagonal direction, and the second color pixel G and the third color pixel B are adjacent to each other in another diagonal direction.

The white pixels W are arranged in a row in a white column C12 of the first unit column C1. The respective white pixels W are formed to correspond to two color pixels R and G positioned in the second pixel column of the color column C11. Upper and lower edges of the white pixel W can be aligned with upper and lower edges of the two color pixels R and G.

The second color pixel G and the third color pixel B can be alternately arranged in a first pixel column of a color column C21 of a second unit column C2, and the first color pixel R and the third color pixel B can be alternately arranged in a second pixel column of the color column C21 of the second unit column C2. In the color column C21, the third color pixels B are adjacent to each other in one diagonal direction, and the first color pixel R and the second color pixel G are adjacent to each other in another diagonal direction.

The white pixels W are arranged in a row in a white column C22 of the second unit column C2. The respective white pixels W are formed to correspond to two color pixels G and B positioned in the second pixel column of the color column C21. Upper and lower edges of the white pixel W can be aligned with upper and lower edges of the two color pixels G and B.

The first color pixel R and the second color pixel G can be alternately arranged in a first pixel column of a color column C31 of a third unit column C3, and the second color pixel G and the third color pixel B can be alternately arranged in a second pixel column of the color column C31 of the third unit column C3. In the color column C31, the second color pixels G are adjacent to each other in one diagonal direction, and the first color pixel R and the third color pixel B are adjacent to each other in another diagonal direction.

The white pixels W are arranged in a row in a white column C32 of the third unit column C3. The respective white pixels W are formed to correspond to two color pixels R and G positioned in the second pixel column of the color column C31. Upper and lower edges of the white pixel W can be aligned with upper and lower edges of the two color pixels R and G.

Continuous structures of the first to third unit columns C1, C2, and C3 can be repeated from a fourth unit column C4.

Referring to FIGS. 2 to 5, the white pixels W included in the unit columns C1, C2, C3, . . . neighboring to each other can be formed to be aligned with each other in the row direction. That is, upper and lower edges of a plurality of white pixels W arranged in the row direction can be aligned with each other.

When the display device has the pixel layout according to an exemplary embodiment, rendering-driving using sharing of various pixels is possible to at the time of driving the display device. When three different color pixels R, G and B and at least one white pixel W configure one unit pixel to display an image, positions of the white pixel W in the unit pixel can be various, such that sharing of various pixels is possible. Therefore, an image having a higher resolution can be displayed, such that a natural image can be represented, and since each unit pixel includes the white pixel W, a luminance of the image is increased, such that power consumption can be decreased.

A unit pixel SP1 including the white pixels W of the first unit column C1 can variously include three color pixels R, G, and B adjacent to the white pixels W.

FIGS. 2 to 5 show examples in which unit pixels including one white pixel W are variously configured in the display device having the same pixel structure. The unit pixel can variously include the white pixel W and the three color pixels R, G, and B adjacent to the white pixel W. The three color pixels R, G, and B adjacent to the white pixel W in one unit pixel can be included in the same unit column as a unit column in which the white pixel W is included or be included in a unit column adjacent to the unit column in which the white pixel W is included.

Entire shapes of different unit pixels can be the same as each other, and positions of the white pixels X in the respective unit pixels can be the same as or different from each other, but are not limited thereto.

Figure 2:
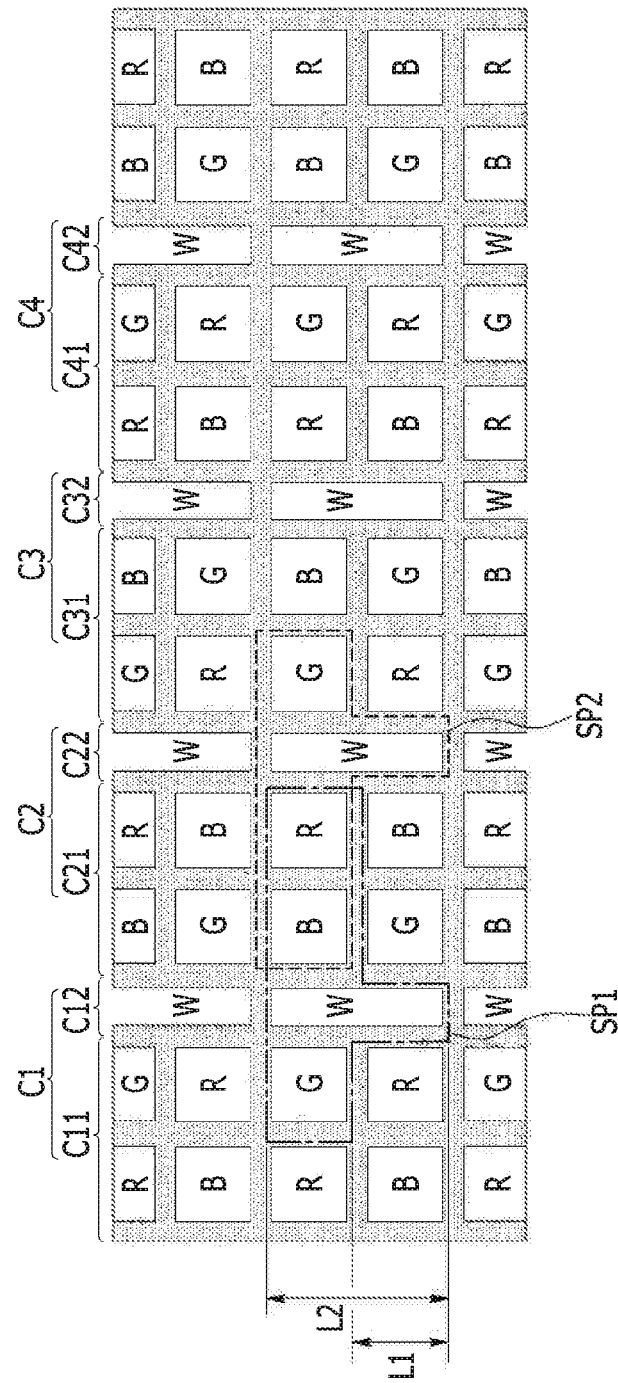

First, referring to FIG. 2, a unit pixel SP1 includes, for example, one white pixel W of a first unit column C1, a second color pixel G positioned at an upper portion in two color pixels R and G adjacent to the left of the white pixel W, a third color pixel B positioned at an upper portion in two color pixels G and B adjacent to the right of the white pixel W, and a first color pixel R adjacent to the right of the third color pixel B to display one image.

A unit pixel SP2 including a white pixel W of a second unit column C2 can include, for example, the white pixel W, a first color pixel R positioned at an upper portion in two color pixels R and B adjacent to the left of the white pixel W, a third color pixel B adjacent to the left of the first color pixel R, and a second color pixel G positioned at an upper portion in two color pixels R and G adjacent to the right of the white pixel W to display one image.

The unit pixel SP1 and the unit pixel SP2 can share one first color pixel R and one third color pixel B positioned in one unit column C2 with each other to display the respective images.

Figure 3:
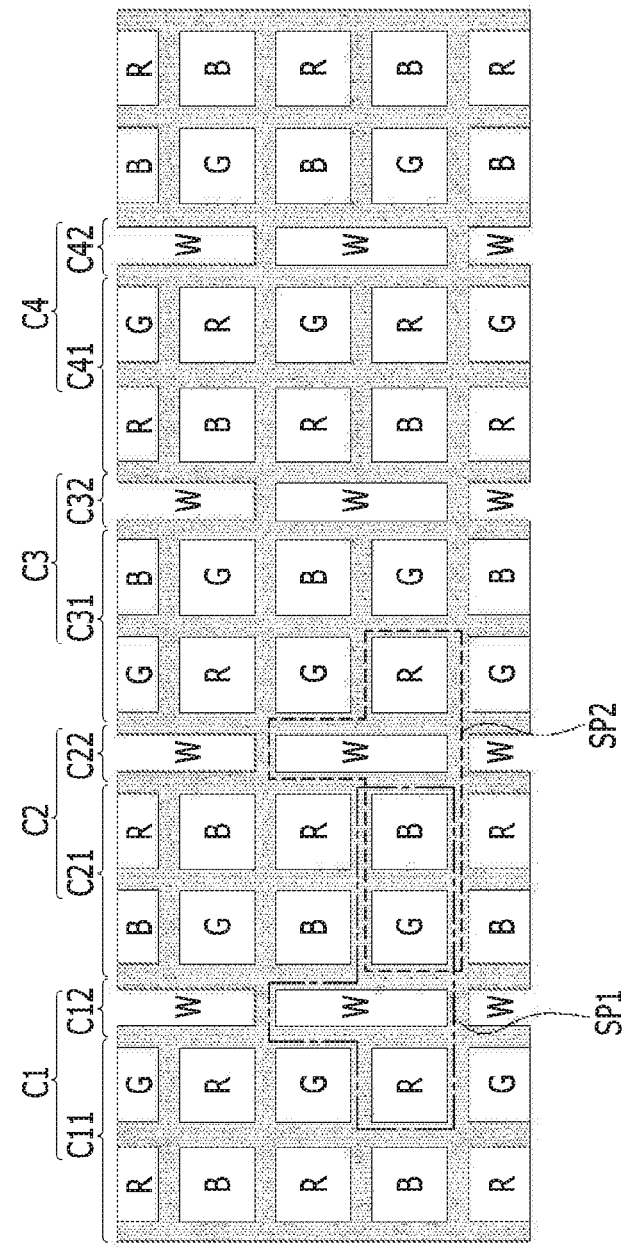

Next, referring to FIG. 3, a unit pixel SP1 includes one white pixel W of a first unit column C1, a first color pixel R positioned at a lower portion in two color pixels R and G adjacent to the left of the white pixel W, a second color pixel G positioned at a lower portion in two color pixels G and B adjacent to the right of the white pixel W, and a third color pixel B adjacent to the right of the second color pixel G to display one image.

A unit pixel SP2 including a white pixel W of a second unit column C2 can include the white pixel W, a third color pixel B positioned at a lower portion in two color pixels R and B adjacent to the left of the white pixel W, a second color pixel G adjacent to the left of the third color pixel B, and a first color pixel R positioned at a lower portion in two color pixels R and G adjacent to the right of the white pixel W to display one image.

The unit pixel SP1 and the unit pixel SP2 can share one second color pixel G and one third color pixel B positioned in one unit column C2 with each other to display the respective images.

Figure 4:
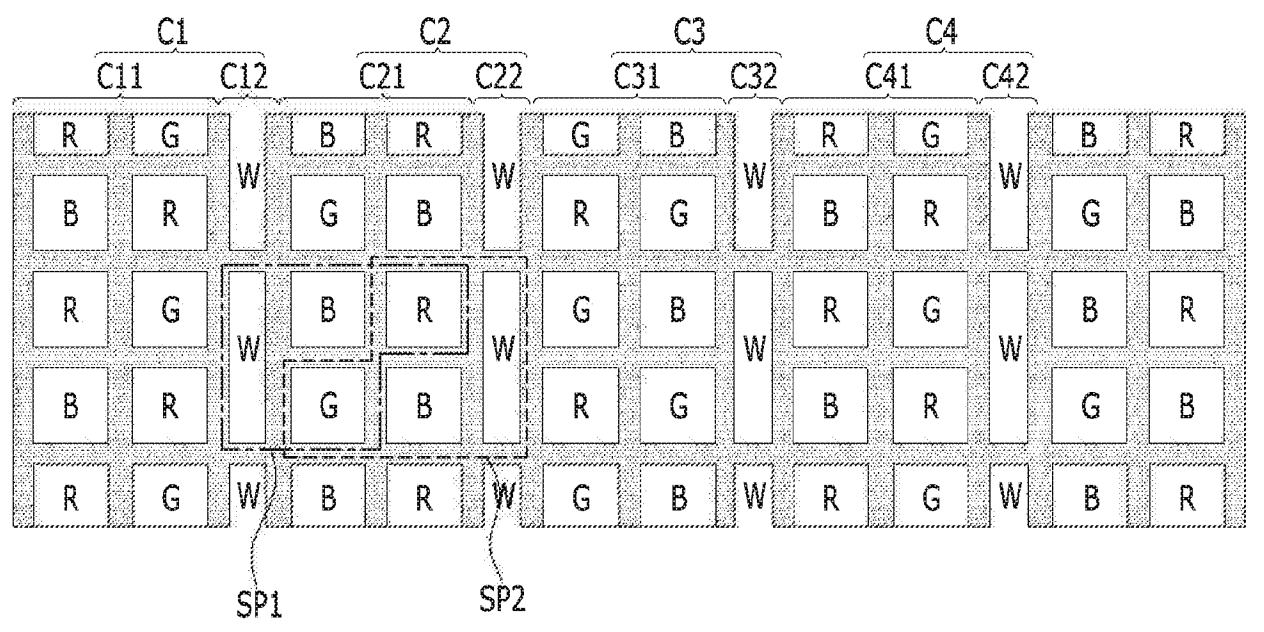

Next, referring to FIG. 4, a unit pixel SP1 includes one white pixel W of a first unit column C1, two color pixels G and B adjacent to the right of the white pixel W, and a first color pixel R adjacent to the right of the third color pixel B to display one image.

A unit pixel SP2 including a white pixel W of a second unit column C2 can include the white pixel W, two color pixels R and B adjacent to the left of the white pixel W, and a second color pixel G adjacent to the left of the third color pixel B to display one image.

The unit pixel SP1 and the unit pixel SP2 can share one first color pixel R and one second color pixel G positioned in one unit column C2 with each other to display the respective images.

Figure 5:
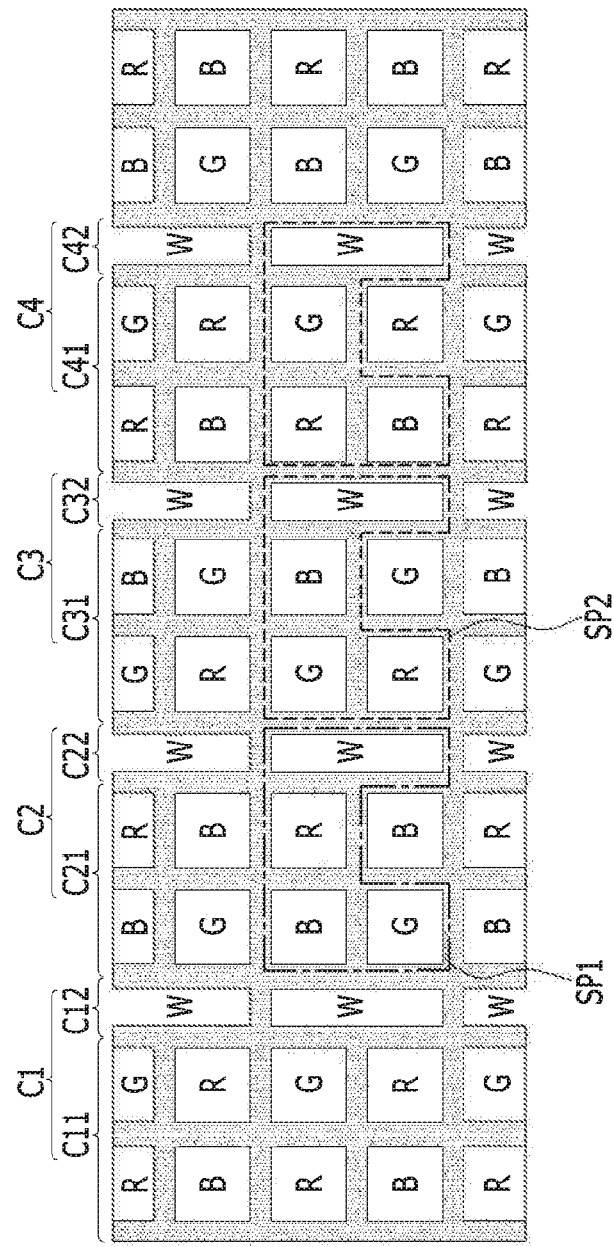

Next, referring to FIG. 5, a unit pixel SP1 can include one white pixel W of a second unit column C2, a first color pixel R positioned at an upper portion in two color pixels R and G adjacent to the left of the white pixel W, a third color pixel B adjacent to the left of the first color pixel R, and a second color pixel G adjacent to a lower portion of the third color pixel B to display one image.

A unit pixel SP2 including a white pixel W of a third unit column C3 can include the white pixel W, a third color pixel B positioned at an upper portion in two color pixels G and B adjacent to the left of the white pixel W, a second color pixel G adjacent to the left of the third color pixel B, and a first color pixel R adjacent to a lower portion of the second color pixel G to display one image.

That is, each unit pixel SP1 and SP2 can include one white pixel W of each unit column C1, C2, C3, . . . and three different color pixels R, G, and B included in color columns C11, C21, C31, . . . adjacent to the white pixel W to display the image.

According to the present exemplary embodiment, the unit pixel SP1 and the unit pixel SP2 can not share the color pixels R, G, and B with each other.

Next, referring to FIGS. 6 to 9, layouts and structures of pixels of the display device according to the present exemplary embodiment can be substantially the same as those of exemplary embodiments of FIGS. 2 to 5 except for a relative layout and a position of a white pixel W. According to the present exemplary embodiment, the white pixels W included in the unit columns C1, C2, C3, . . . neighboring to each other are not aligned with each other in the row direction, but can be formed to be alternated with each other. That is, upper and lower edges of a plurality of white pixels W arranged in the row direction are not aligned with each other. In detail, in the case in which a while pixel W of one unit column C1, C2, C3, . . . is aligned in an i-th row and an i+1-th row among rows configured of the color pixels R, G, and B, a white pixel W of a unit column C1, C2, C3, . . . neighboring to one unit column C1, C2, C3, . . . can be aligned in an i−1-th row or an i-th row or be aligned in an i-th row or an i+1-th row.

FIGS. 6 to 9 show examples in which unit pixels including one white pixel W are variously configured in the display device having the same pixel structure. The unit pixel can variously include the white pixel W and the three color pixels R, G, and B adjacent to the white pixel W.

Figure 6:
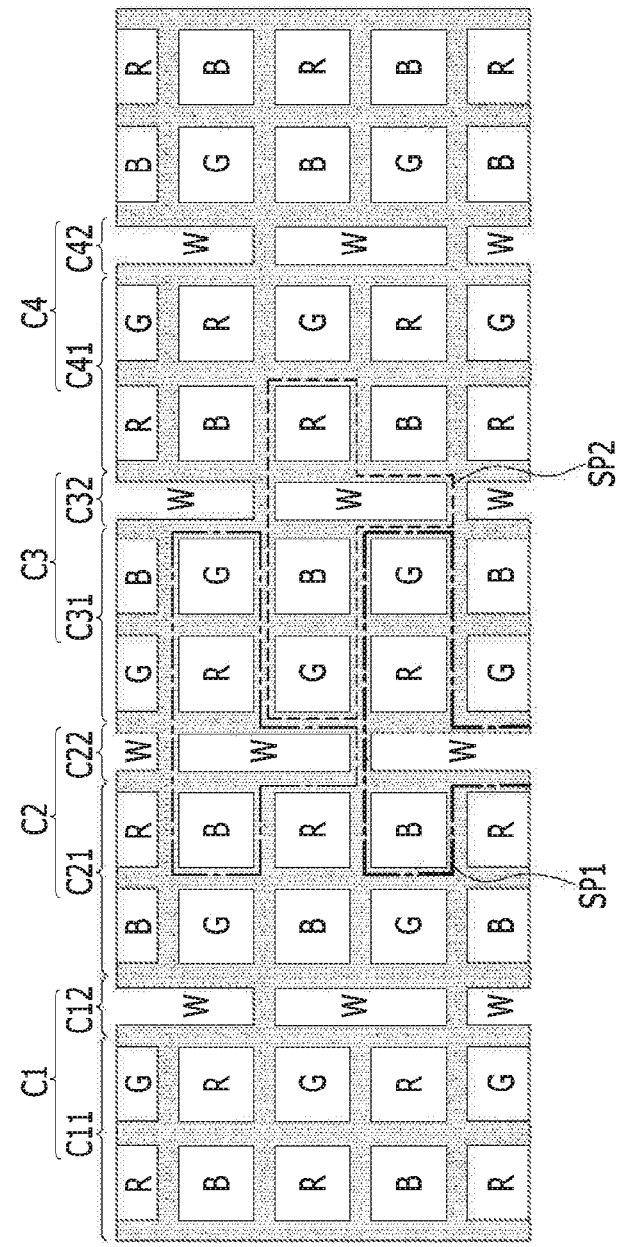

First, referring to FIG. 6, a unit pixel SP1 includes, for example, one white pixel W of a second unit column C2, a third color pixel B positioned at an upper portion in two color pixels R and B adjacent to the left of the white pixel W, a first color pixel R positioned at an upper portion in two color pixels R and G adjacent to the right of the white pixel W, and a second color pixel G adjacent to the right of the first color pixel R to display one image.

A unit pixel SP2 including a white pixel W of a third unit column C3 can include, for example, the white pixel W, a third color pixel B positioned at an upper portion in two color pixels G and B adjacent to the left of the white pixel W, a second color pixel G adjacent to the left of the third color pixel B, and a first color pixel R positioned at an upper portion in two color pixels R and B adjacent to the right of the white pixel W to display one image.

In some embodiments, the unit pixel SP1 and the unit pixel SP2 do not share the color pixels R, G, and B with each other. In addition, in two unit pixels SP1 and SP2, positions of the white pixels W can be different from each other.

Figure 7:
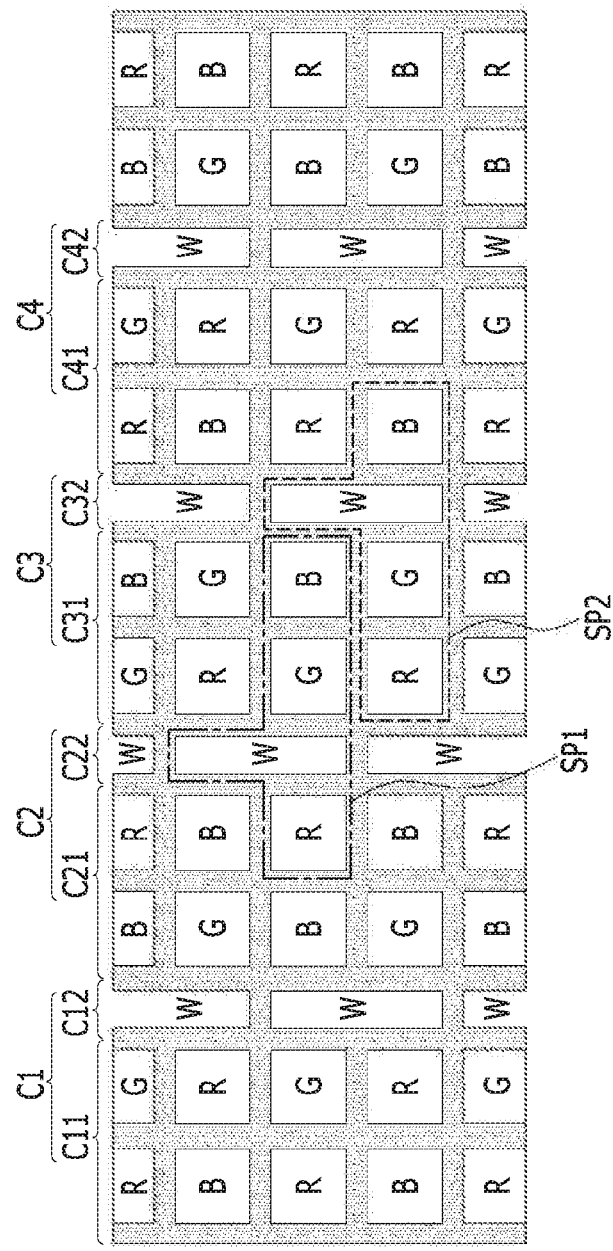

First, referring to FIG. 7, a unit pixel SP1 includes, for example, one white pixel W of a second unit column C2, a first color pixel R positioned at a lower portion in two color pixels R and B adjacent to the left of the white pixel W, a second color pixel G positioned at a lower portion in two color pixels R and G adjacent to the right of the white pixel W, and a third color pixel B adjacent to the right of the second color pixel G to display one image.

A unit pixel SP2 including a white pixel W of a third unit column C3 can include, for example, the white pixel W, a second color pixel G positioned at a lower portion in two color pixels G and B adjacent to the left of the white pixel W, a first color pixel R adjacent to the left of the second color pixel G, and a third color pixel B positioned at a lower portion in two color pixels R and B adjacent to the right of the white pixel W to display one image.

In some embodiments, the unit pixel SP1 and the unit pixel SP2 do not share the color pixels R, G, and B with each other. In addition, in two unit pixels SP1 and SP2, positions of the white pixels W can be different from each other.

Figure 8:
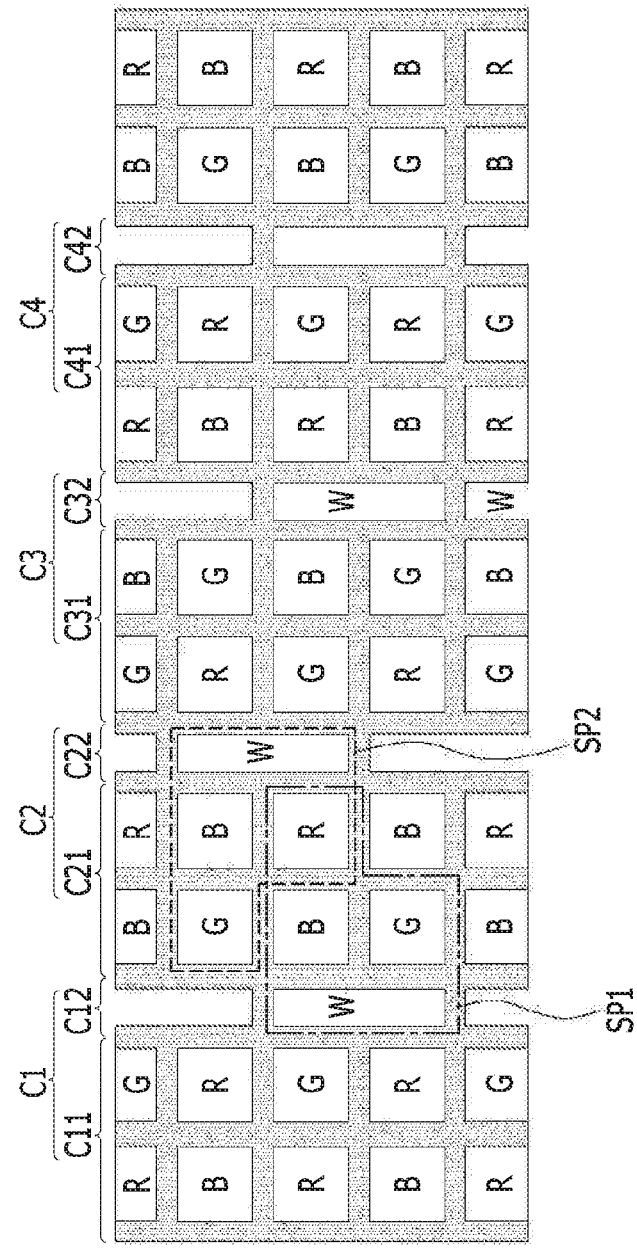

Next, referring to FIG. 8, a unit pixel SP1 includes one white pixel W of a first unit column C1, two color pixels G and B adjacent to the right of the white pixel W, and a first color pixel R adjacent to the right of the third color pixel B to display one image.

A unit pixel SP2 including a white pixel W of a second unit column C2 can include the white pixel W, two color pixels R and B adjacent to the left of the white pixel W, and a second color pixel G adjacent to the left of the third color pixel B to display one image.

The unit pixel SP1 and the unit pixel SP2 can share one first color pixel R positioned in one unit column C2 with each other to display the respective images. In addition, in two unit pixels SP1 and SP2, positions of the white pixels W can be different from each other.

Figure 9:
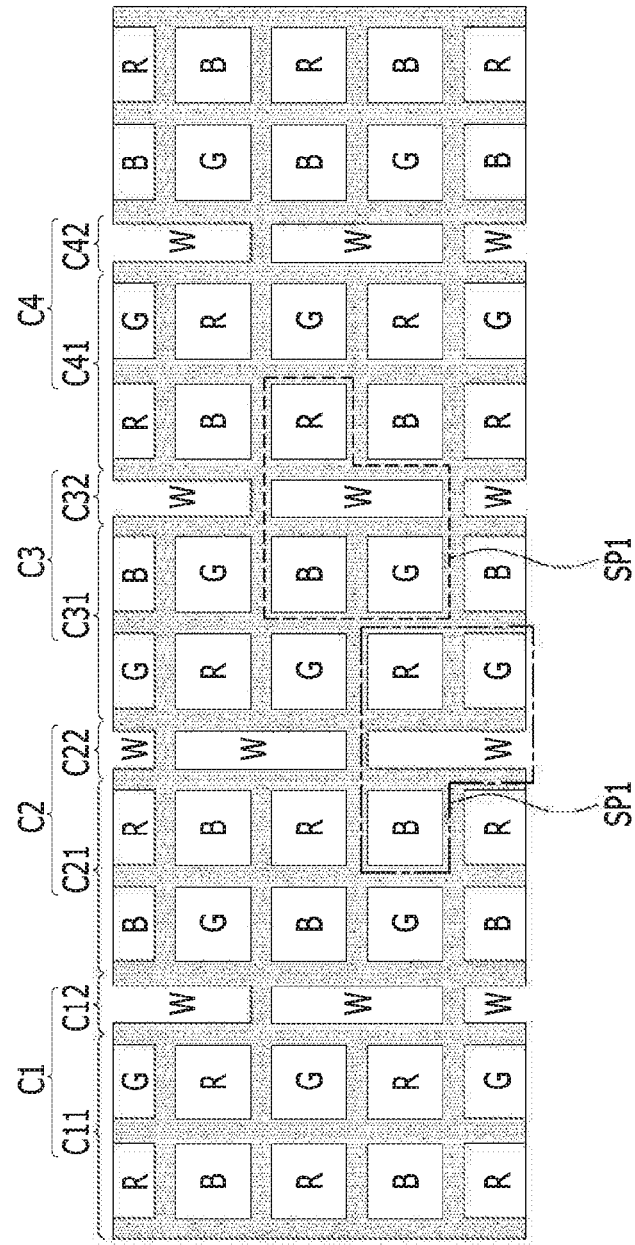

Next, referring to FIG. 9, a unit pixel SP1 includes one white pixel W of a second unit column C2, a third color pixel B positioned at an upper portion in two color pixels R and B adjacent to the left of the white pixel W, and two color pixels R and G adjacent to the right of the white pixel W to display one image.

A unit pixel SP2 including a white pixel W of a third unit column C3 can include the white pixel W, two color pixels G and B adjacent to the left of the white pixel W, and a first color pixel R positioned at an upper portion in two color pixels R and b adjacent to the right of the white pixel W to display one image.

That is, each unit pixel SP1 and SP2 can include one white pixel W of each unit column C1, C2, C3, . . . and three different color pixels R, G, and B included in color columns C11, C21, C31, . . . adjacent to the white pixel W to display the image.

According to the present exemplary embodiment, the unit pixel SP1 and the unit pixel SP2 do not share the color pixels R, G, and B with each other. Shapes of different unit pixels SP1 and SP2 can be substantially symmetrical to each other in the horizontal direction.

Figure 10:
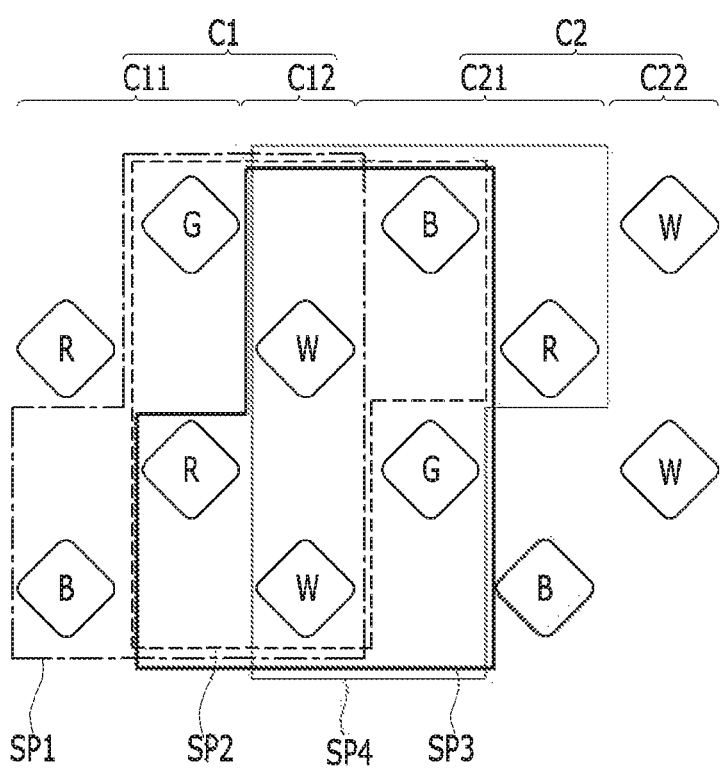
Figure 11:
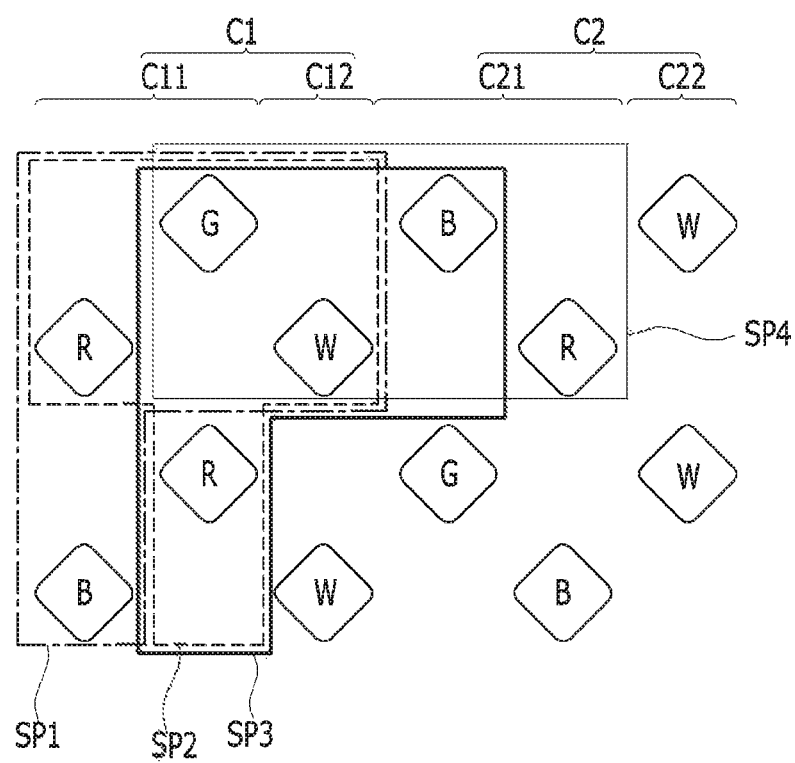

FIGS. 10 and 11 are views illustrating a pixel layout and a driving method of a display device according to an exemplary embodiment, respectively.

Referring to FIGS. 10 and 11, a display device according to the present exemplary embodiment has a pixel layout or a structure that is substantially the same as that of the display device described above and shown in FIGS. 2 to 9 except for positions of transmitting regions of color pixels R, G, and B and a white pixel W and the size of the white pixel W. Portions different from those of the above-mentioned exemplary embodiment will be mainly described.

Referring to FIGS. 10 and 11, color pixels R, G, and B and white pixels W be included in a plurality of unit columns C1, C2, . . . in which transmitting regions displaying an image and transmitting light therethrough are sequentially arranged. The respective unit columns C1, C2, . . . include color columns C11, C21, C31, . . . in which the color pixels R, G, and B are arranged and white columns C12, C22, ... in which the white pixels W are arranged. The color columns C11, C21, ... and the white columns C12, C22, ... can be adjacent to each other. Therefore, when generally viewed, the color columns C11, C21, ... and the white columns C12, C22, ... can be alternately formed in the row direction.

The respective color columns C11, C21, ... include two pixel columns adjacent to each other. Two kinds of color pixels R, G, and B representing two different colors from each other are alternately arranged in the column direction in a first pixel column formed at the left in the two pixel columns included in one color column C11, C21, ... , and two kinds of color pixels R, G, and B representing two different colors from each other are also alternately arranged in the column direction in a second pixel column, which is the other pixel column. One color pixel R, G, and B of two color pixels R, G, and B included in the first pixel column and one color pixel R, G, and B of two color pixels R, G, and B included in the second pixel column can represent the same color. In addition, the other color pixel R, G, and B of the two color pixels R, G, and B included in the first pixel column and the other color pixel R, G, and B of the two color pixels R, G, and B included in the second pixel column can represent different colors from each other. Two color pixels R, G, and B adjacent to each other in the row direction in one color column C11, C21, ... can represent different colors from each other.

Layouts of color pixels R, G, and B included in color columns C11, C21, ... included in three unit columns C1, C2, ... adjacent to each other can be different from each other, layouts of pixels R, G, B, and W included in the three unit columns C1, C2, ... adjacent to each other can be repeated in the row direction.

Sizes of the plurality of color pixels R, G and B can be constant or be different from each other. A shape and/or a size of the white pixel W can be the same as those of the color pixels R, G, and B. A shape of each of the color pixels R, G and B and the white pixel W can be approximately a rhombus, but is not limited thereto.

Color pixels R, G, and B positioned in a first pixel column positioned in one color column C11, C21, ... and color pixels R, G, and B positioned in a second pixel column positioned in one color column C11, C21, ... are not aligned with each other in the row direction, but can be formed to be alternated with each other. That is, one color pixel R, G, and B of the second pixel column positioned at the right in one color column C11, C21, ... can be formed to be aligned with approximately the center between two adjacent color pixels R, G, and B of the first pixel column positioned at the left in C11, C21, ... .

Likewise, white pixels W positioned in white columns C12, C22, ... and color pixels R, G, and B positioned in color columns C11, C21, ... adjacent to the white columns C12, C22, ... are not aligned with each other in the row direction, but can be formed to be alternated with each other. That is, one color pixel R, G, and B of the second pixel column positioned at the right in one color column C11, C21, ... can be formed to be aligned with approximately the center between two white pixels W positioned in white columns C12, C22, ... adjacent to the right of the second pixel column.

Therefore, two adjacent color pixels R, G, and B in two adjacent color columns C11, C21, ... can be adjacent to each other in a diagonal direction, such that the two color pixels R, G, and B can be spaced apart from each other at a sufficient distance. In addition, one color pixel R, G, and B, and the white pixel W adjacent to each other in the color column C11, C21, ... and the white columns C12, C22, ... adjacent to each other can also be adjacent to each other in the diagonal direction, such that the color pixel R, G, and B, and the white pixel W can be spaced apart from each other at a sufficient distance.

Color pixels R, G, and B, or white pixels W formed in an odd numbered column or an even numbered column can be formed to be aligned with each other in the row direction.

When the display device has the pixel layout according to an exemplary embodiment, rendering-driving using sharing of various pixels is possible at the time of driving the display device. When three different color pixels R, G and B and at least one white pixel W configure one unit pixel to display an image, positions of the white pixel W in the unit pixel can be various, such that sharing of various pixels is possible. Therefore, an image having a higher resolution can be displayed, such that a natural image can be represented, and since each unit pixel includes the white pixel W, a luminance of the image is increased, such that power consumption can be decreased.

For example, unit pixels SP1, SP2, and SP3 including the white pixels W of the first unit column C1 variously include three color pixels R, G, and B adjacent to the white pixels W. In this case, entire shapes of different unit pixels SP1, SP2, and SP3 including the same white pixels W can be different from each other, and positions of the white pixels W in the respective unit pixels SP1, SP2, and SP3 can be different from each other.

Referring to FIG. 10, a unit pixel SP1 includes, for example, two white pixels W of a first unit column C1 adjacent to each other, two color pixels R and G adjacent to the left of the two white pixels W in the diagonal direction, and a third color pixel B adjacent to the left of one of the two color pixels R and G in the diagonal direction to display one image.

A unit pixel SP2 can include, for example, two white pixels W of a first unit column C1 adjacent to each other, two color pixels R and G adjacent to the left of the two white pixels W in the diagonal direction, and a third color pixel B adjacent to the right of one of the two white pixels W in the diagonal direction to display one image.

A unit pixel SP3 can include, for example, two white pixels W of a first unit column C1 adjacent to each other, a first color pixel R adjacent to the left of one of the two white pixels W in the diagonal direction, and two color pixels B and G adjacent to the right of the two white pixels W in the diagonal direction to display one image.

In addition, various unit pixels can be configured, such that rendering-driving using sharing of various pixels is possible and an image having a high resolution can be displayed. Therefore, a natural image can be represented.

The configurations of the unit pixels SP1, SP2, and SP3 according to an exemplary embodiment shown in FIG. 10 can be similarly applied to several exemplary embodiments described above.

Next, a configuration of a unit pixel according to another exemplary embodiment will be described with reference to FIG. 11.

Referring to FIG. 11, a driving method of a display device according to the present exemplary embodiment is substantially the same as the driving method of a display device according to an exemplary embodiment described above and shown in FIG. 10 except that one unit pixel SP1, SP2, SP3, and SP4 includes one white pixel W.

In detail, a unit pixel SP1 can include, for example, one white pixel W of a first unit column C1, a second color pixel G adjacent to the left of the white pixel W in the diagonal direction, a first color pixel R adjacent to the left of the second color pixel G in the diagonal direction, and a third color pixel B adjacent to a lower portion of the first color pixel R to display one image.

A unit pixel SP2 can include, for example, one white pixel W of a first unit column C1, two color pixels R and G adjacent to the left of the white pixel W in the diagonal direction, and one first color pixel R adjacent to the left of the two color pixels R and G in the diagonal direction to display one image.

A unit pixel SP3 can include, for example, one white pixel W of a first unit column C1, two color pixels R and G adjacent to the left of the white pixel W in the diagonal direction, and a third color pixel B adjacent to the right of the white pixel W in the diagonal direction to display one image.

A unit pixel SP4 can include, for example, one white pixel W of a first unit column C1, a second color pixel G adjacent to the left of the white pixel W in the diagonal direction, a third color pixel B adjacent to the right of the white pixel W in the diagonal direction, and a first color pixel R adjacent to the right of the third color pixel B in the diagonal direction to display one image.

In addition, various unit pixels can be configured, such that rendering-driving using sharing of various pixels is possible and an image having a high resolution can be displayed. Therefore, a natural image can be represented.

The configurations of the unit pixels SP1, SP2, and SP3 according to an exemplary embodiment shown in FIG. 11 can be similarly applied to several exemplary embodiments described above and shown in FIGS. 2 to 9.

Figure 12:
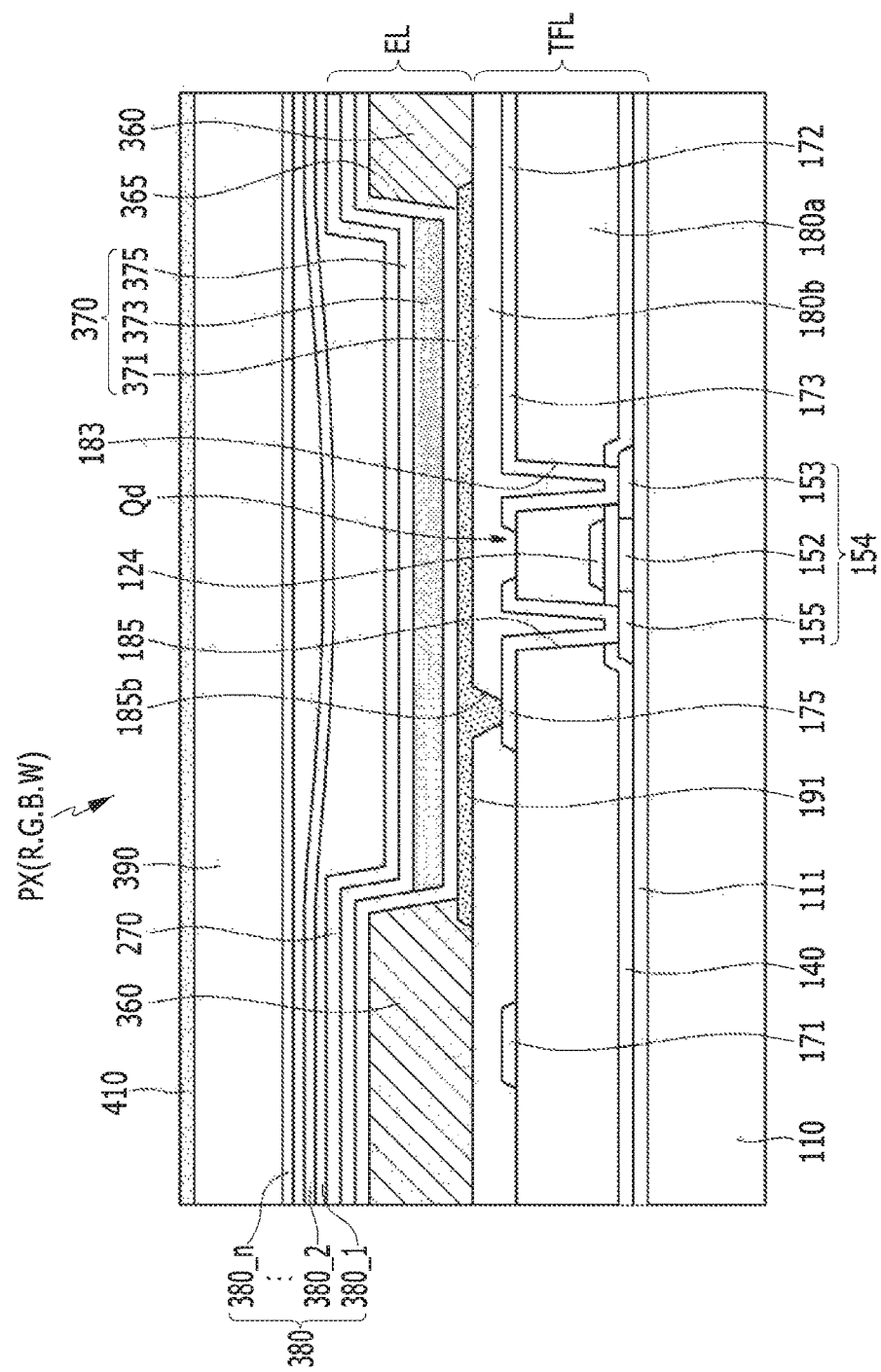
FIG. 12 is a cross-sectional view of the display device according to an exemplary embodiment.

FIG. 12 is a cross-sectional view of the display device according to an exemplary embodiment.

Referring to FIG. 12, the display device according to an exemplary embodiment can be an OLED display.

The display device according to an exemplary embodiment includes a lower substrate 110. The lower substrate 110 can include, glass, plastic, or the like.

At least one barrier layer 111 can be positioned on the lower substrate 110. The barrier layer 111 can prevent impurities from the outside from passing through the lower substrate 100 and permeating upward. The barrier layer 111 can include at least one of an inorganic layer and an organic layer. For example, the barrier layer 111 can be formed of at least one of a silicon nitride (SiNx), a silicon oxide (SiOx), and a silicon oxynitride (SiOxNy). The barrier layer 111 can also be omitted.

A plurality of semiconductors 154 are positioned on the barrier layer 111. The semiconductor 154 can include a channel region 152 and a source region 153 and a drain region 155 each positioned at both sides of the channel region 152 and formed by doping. The semiconductor 154 can be formed of an amorphous silicon, a polycrystalline silicon, or an oxide semiconductor.

The gate insulating layer 140 formed of a silicon nitride (SiNx), a silicon oxide (SiOx), or the like, is positioned on the semiconductor 150.

A plurality of gate conductors including a plurality of gate signal lines (not shown) and gate electrodes 124 are positioned on the gate insulating layer 140. The gate electrode 124 can overlap a portion of semiconductor 154, particularly, the channel region 152.

A first passivation layer 180a is positioned on the gate insulating layer 140 and the gate conductor. The first passivation layer 180a and the gate insulating layer 140 can include a contact hole 183 exposing the source region 153 of the semiconductor 154 and a contact hole 185 exposing the drain region 155 of the semiconductor 154.

A plurality of data conductors including a plurality of data lines 171, a plurality of input electrodes 173, and a plurality of output electrodes 175 are positioned on the first passivation layer 180a. The data line 171 transfer a data signal, and intersect with a scan signal line. The input electrode 173 is connected to the data line 171. The output electrode 175 is disconnected from the data line 171. The input electrode 173 and the output electrode 175 face each other on the semiconductor 154.

The input electrode 173 and the output electrode 175 can be connected to the source region 153 and the drain region 155 of the semiconductor 154 through the contact holes 183 and 185, respectively.

The gate electrode 124, the input electrode 173, and the output electrode 175 form a driving thin film transistor Qd together with the semiconductor 154. However, a structure of the driving thin film transistor Qd is not limited thereto, but can be variously modified.

A second passivation layer 180b can be positioned on the data conductor. The second passivation layer 180b can be formed of an inorganic insulator such as a silicon nitride or a silicon oxide. The second passivation layer 180b can have a contact hole 185b exposing the output electrode 175.

A layer from the barrier layer 111 to the second passivation layer 180b is called a thin film transistor layer TFL.

A plurality of pixel electrodes 191 are positioned on the second passivation layer 180b.

The pixel electrode 191 of each pixel PX is physically and electrically connected to the output electrode 175 through the contact hole 185b of the second passivation layer 180b. The pixel electrode 191 can include a transreflective conductive material or a reflective conductive material.

A pixel definition layer (also referred to as a partition wall) 360 can be positioned on the second passivation layer 180b. The pixel definition layer 360 has a plurality of openings exposing the pixel electrode 191. The opening of the pixel definition layer 360 exposing the pixel electrode 191 can define a unit display area in which light is emitted from each pixel PX. The pixel definition layer 360 can also be omitted.

A light emitting member 370 is positioned on the pixel definition layer 360 and the pixel electrode 191. The light emitting member 370 can include a first organic common layer 371, a plurality of emission layers 373, and a second organic common layer 375 that are sequentially stacked. The first and second organic common layers 371 and 375 are to improve light emitting efficiency of the emission layer 373, and any one of the first and second organic common layers 371 and 375 can also be omitted.

A counter electrode 270 transferring a common voltage is positioned on the light emitting member 370. The counter electrode 270 can include a transparent conductive material. For example, the counter electrode 270 is formed of a transparent conductive material and be formed by thinly stacking a metal such as calcium (Ca), barium (Ba), magnesium (Mg), aluminum (Al), silver (Ag), or the like, to have light transmissivity.

The pixel electrode 191 of each pixel PX, the light emitting member 370, and the counter electrode 270 can be included in a light emitting element, and one of the pixel electrode 191 and the counter electrode 270 becomes a cathode and the other thereof becomes an anode.

A layer from the pixel definition layer 360 and the pixel electrode 191 to the counter electrode 270 is called a light emitting element layer EL.

An encapsulating part 380 is positioned on the counter electrode 270. The encapsulation part 380 can encapsulate the light emitting element layer EL, that is, the light emitting member 370 and the counter electrode 270 to prevent moisture and/or oxygen from permeating into the light emitting element layer from the outside.

The encapsulation part 380 can include a plurality of encapsulating thin film layers 380_1, 380_2, 380_3, ... 380_n. The encapsulating thin film layers 380_1, 380_2, 380_3 ... 380_n include at least one inorganic layer and at least one organic layer. The inorganic layer and the organic layer can be alternately stacked.

Although the OLED display has been described as an example of the display device in the present exemplary embodiment, the display device according to an exemplary embodiment is not limited thereto, but can be various display devices such as a liquid crystal display, and the like. In this case, a stricture of the thin film transistor layer TFL and the light emitting element layer EL can be differently configured so as to be appropriate for each display device.

The color pixels R, G, and B or the white pixel W according to several exemplary embodiments described above can have a cross-sectional structure shown in FIG. 12, but are not limited thereto.

While the inventive technology has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A display device, comprising:
a plurality of unit columns of pixels arranged in a first direction, wherein at least one of the unit columns includes:
a color column of pixels including a first pixel column and a second pixel column, wherein the color column includes a plurality of color pixels each configured to display a plurality of colors other than white; and
a white column of pixels including a plurality of white pixels arranged in the first direction,
wherein the color column includes at least two color pixels,
each of the first and the second pixel column includes two different colors arranged alternately in the first direction, and
one color pixel in the first pixel column and one color pixel in the second pixel column in one diagonal direction are configured to display substantially the same color as each other, and another color pixel in the first pixel column and another color pixel in the second pixel column in the other diagonal direction are configured to display different colors from each other,
wherein the plurality of unit columns include a first color column, a second color column, and a third color column that are adjacent to each other with the white pixels therebetween in the first direction,
each of the first color column, the second color column, and the third color column includes the first pixel column and the second pixel column,
the color pixels representing the same color in the first color column and another color pixel in the second pixel column of the second color column in the one diagonal direction are configured to display different colors from each other,
the color pixels representing the same color in the first color column and another color pixel in the first pixel column of the third color column in the one diagonal direction are configured to display different colors from each other,
the length of the white pixels in the first direction is about two times the length of the color pixel in the first direction, and
color pixels adjacent to one of the white pixels in the other diagonal direction are configured to display substantially the same color as each other, and color pixels adjacent to one of the white pixels in the one diagonal direction are configured to display different colors from each other.

2. The display device of claim 1, wherein the white pixels included in two adjacent unit columns are aligned in the first direction.

3. The display device of claim 1, wherein the white pixels included in two adjacent unit columns are not aligned in the first direction.

4. The display device of claim 1, wherein the unit columns comprise first to third columns that are adjacent to each other in the first direction, and
wherein the arrangements of the color pixels included in one of the first to third unit columns are different from the color pixels in the others of the first to third unit columns.

5. The display device of claim 1, wherein the length of the white pixels in a second direction crossing the first direction is less than the length of the color pixel in the second direction.

6. The display device of claim 1,
wherein the color pixels in every other pixel column in the first direction are aligned with each other in the first direction, and
wherein the color pixels in the pixel column and the white pixels in the white column adjacent to the pixel column in the first direction are alternately arranged in the first direction.

7. The display device of claim 6, wherein the color pixel and the white pixels have shapes or sizes that are substantially the same as each other.

8. The display device of claim 7, further, comprising:
a signal controller configured to receive and process an input image signal; and
a rendering driver configured to receive the processed image signal from the signal controller and render the received image signal for a unit pixel including the white pixels and a plurality of color pixels adjacent to the white pixel.

9. The display device of claim 8, wherein the unit pixel includes a first unit pixel and a second unit pixel sharing at least one of the color pixels with each other.

10. A method of driving a display device including a plurality of unit columns of pixels arranged in a first direction, at least one of the unit columns including a color column of pixels including a first pixel column and a second pixel column, wherein the color column includes a plurality of color pixels configured to display colors other than white and a white column of pixels including a plurality of white pixels arranged in the first direction, the method comprising:
receiving an input image signal;
rendering the image signal for a unit pixel to output an output image signal;
generating a data voltage based on the rendered output image signal; and inputting the data voltage to the unit columns, wherein the unit pixel includes the white pixel and a plurality of the color pixels adjacent to the white pixel, wherein the color column includes at least two color pixels, each of the first and the second pixel column includes two different colors arranged alternately in the first direction, and one color pixel in the first pixel column and one color pixel in the second pixel column in one diagonal direction are configured to display substantially the same color as each other, and another color pixel in the first pixel column and another color pixel in the second pixel column in the other diagonal direction are configured to display different colors from each other, wherein the plurality of unit columns include a first color column, a second color column, and a third color column that are adjacent to each other with the white pixels therebetween in the first direction.

each of the first color column, the second color column, and the third color column includes the first pixel column and the second pixel column, the color pixels representing the same color in the first color column and another color pixel in the second pixel column of the second color column in the one diagonal direction are configured to display different colors from each other, the color pixels representing the same color in the first color column and another color pixel in the first pixel column of the third color column in the one diagonal direction are configured to display different colors from each other, the length of the white pixels in the first direction is about two times the length of the color pixel in the first direction, and color pixels adjacent to the white pixel in the other diagonal direction are configured to display substantially the same color as each other, and color pixels adjacent to the white pixel in the one diagonal direction are configured to display different colors from each other.

11. The display device of claim 10, wherein the unit pixels include a first unit pixel and a second unit pixel sharing at least one of the color pixels with each other.

12. The display device of claim 10, wherein the input image signal includes an image signal corresponding to a plurality of colors to be displayed by the color pixels.

* * * * *